United States Patent [19]

Gavrilov et al.

[11] Patent Number: 4,461,799

[45] Date of Patent: Jul. 24, 1984

[54] CUTTING TOOLS WITH WEAR-RESISTANT COATING OF HEAT-RESISTANT COMPOUNDS OF HIGH-MELTING METALS AND METHOD FOR MANUFACTURING SAME

[75] Inventors: Alexei G. Gavrilov, Moskovskaya; Galina K. Galitskaya, Moscow; Viktor P. Zhed, Moscow; Andrei K. Sinelschikov, Moscow; Valentin G. Padalka; Albert M. Boyarunas, both of Kharkov; Vyacheslav N. Panin; Vitaly N. Barinov, both of Moscow, all of U.S.S.R.

[73] Assignee: Vsesojuzny Nauchnoissledovatelsky Instrumentalny Institut, Moscow, U.S.S.R.

[21] Appl. No.: 465,829

[22] Filed: Feb. 14, 1983

[51] Int. Cl.$^3$ .............. B23P 15/28; B26D 1/00; B32B 33/00; B05D 1/02

[52] U.S. Cl. ................... 428/210; 51/295; 51/307; 51/309; 148/6; 148/31.5; 204/192 SP; 204/192 N; 407/119; 408/144; 427/34; 427/249; 427/404; 427/419.7; 428/472; 428/698; 428/908.8

[58] Field of Search ........... 427/34, 249, 404, 419.7; 428/210, 472, 698, 908.8; 51/295, 307, 309; 148/6, 31.5; 204/192 SP, 192 N; 407/119; 408/144

[56] References Cited

U.S. PATENT DOCUMENTS

| | | | |
|---|---|---|---|
| 3,804,034 | 4/1974 | Stiglich | 428/698 |
| 3,895,923 | 7/1975 | Wakefield | 428/698 |
| 3,964,937 | 6/1976 | Post et al. | 428/698 |
| 4,054,426 | 10/1977 | White | 51/309 |
| 4,063,909 | 12/1977 | Mitchell | 51/295 |
| 4,108,614 | 8/1978 | Mitchell | 51/295 |
| 4,284,687 | 8/1981 | Dreyer et al. | 428/472 |
| 4,401,719 | 8/1983 | Kobayashi et al. | 428/472 |
| 4,411,960 | 10/1983 | Miyuhara | 428/472 |

FOREIGN PATENT DOCUMENTS 55-48010 10/1980 Japan ...................... 51/295

*Primary Examiner*—James C. Cannon
*Attorney, Agent, or Firm*—McAulay, Fields, Fisher, Goldstein & Nissen

[57] ABSTRACT

Cutting tools according to the invention are provided with a wear-resistant coating of heat-resistant compounds of high-melting metals. A layer of a pure metal is provided between the base material and the coating. The base material is a ceramic or an aluminum oxide-based metal-ceramic material. The intermediate layer is discontinuous. Such tools are manufactured by using condensation of plasma material and ion bombardment in order to successively deposit an intermediate layer of a pure metal and a coating of heat-resistant compounds of high-melting metals on the surface of the base material. The intermediate layer is deposited at a temperature of $\frac{1}{2}T_S > T > \frac{1}{3}T_S$, where $T_S$ is the melting temperature of the metal being deposited and T is the temperature of the tool in ° K. The condensation rate and the duration of deposition are selected bearing in mind that metal is to be deposited only on defects found on the surface of the base material.

3 Claims, No Drawings

CUTTING TOOLS WITH WEAR-RESISTANT COATING OF HEAT-RESISTANT COMPOUNDS OF HIGH-MELTING METALS AND METHOD FOR MANUFACTURING SAME

FIELD OF THE INVENTION

The present invention relates to metal working and is more specifically concerned with cutting tools having a wear-resistant coating of heat-resistant compounds of high-melting metals. The invention is also concerned with a method for manufacturing such tools.

BACKGROUND OF THE INVENTION

There are known cutting tools of metal-ceramic materials based on high-melting metals, which have a wear-resistant coating of heat-resistant compounds, such as carbides and nitrides, of high-melting metals, such as titanium and zirconium. Between the coating and the base material there is an unbroken intermediate layer of a pure metal, such as titanium or zirconium (cf. the thesis by I. A. Derevlyov "Issledovaniye rabotosposobnosti instrumenta s tonkimi pokrytiyami v usloviyakh preryvistogo rezaniya" ("Studies of Wear Resistance of Tools with Thin Coatings Under Discontinuous Cutting Conditions"), Moscow, 1978, pp. 65–68).

The continuous intermediate layer of a pure metal is 0.5 to 1 mu thick and serves as the interface between the coating and the base material. Such tools are extensively used in metal working. In the case of machining constructional materials, they display a wear resistance which is 2 to 3 times as high as that of hard-alloy tools without a wear-resistant coating. On the other hand, such tools are expensive and not readily available. There is known a method for the manufacture of cutting tools of high-speed steels and hard alloys, according to which condensation of plasma matter and ion bombardment are used in order to successively deposit an unbroken intermediate layer of a pure metal and a coating of heat-resistant compounds of high-melting metals on the base material (of. the collection of papers "Progressivnyie technologicheskyie protsessy v instrumentalnom proizvodstve" ("Advanced Methods of Tool Manufacture") ed. by M. F. Semko, D.Sc. (Tech.), Moscow, 1979, pp. 26–28). During the deposition of an unbroken intermediate layer and a coating, tools of high-speed steel are maintained at a temperature below 560° C., while tools of hard alloys are maintained at 800° C. The condensation rate is 40 to 150 Å/sec.

There are known cutting tools of ceramic materials and aluminum oxide-based metal-ceramic materials, which are used to cut steel and cast iron.

These tools are much cheaper than tools of hard alloy-based metal-ceramic materials, but their applications are limited by their physical drawbacks.

The basic disadvantages of such tools are a low resistance of their cutting edges to lateral flexure, and a high sensitivity to thermal shocks.

The low lateral flexure resistance is due to the presence of numerous defects, such as microcracks, pores, and interfaces between grains, in the surface layer of a tool. As a result, the tool is chipped off during cutting.

The above disadvantages could be eliminated by coating such tools with a wear-resistant material, but cutting tools of an aluminum oxide-based metal-ceramic material with a wear-resistant coating are yet unknown.

SUMMARY OF THE INVENTION

It is an object of the present invention to improve the wear resistance of cutting tools.

It is another object of the invention to provide inexpensive cutting tools.

It is a further object of the invention to provide a method for manufacturing wear-resistant and cheap cutting tools.

The invention provides cutting tools with a wear-resistant coating of heat-resistant compounds of high-melting metals and with an intermediate layer of a pure metal between the base material and the coating, which are characterized, according to the invention, in that the base material is a ceramic material or an aluminum oxide-base metal-ceramic material, and in that the intermediate layer is discontinuous.

The invention also provides a method for manufacturing such cutting tools, which comprises condensation of plasma matter and ion bombardment carried out in order to successively deposit an intermediate layer of a pure metal and a coating of heat-resistant compounds of high-melting metals on the base material, which method is characterized, according to the invention, in that the intermediate layer is deposited with the tool being maintained at a temperature of $\frac{1}{2}T_S > T > \frac{1}{3}T_S$, where $T_S$ is the melting temperature of the metal being deposited and T is the temperature of the tool in °K., the condensation rate and the duration of deposition being selected bearing in mind that metal is to be deposited only on defects found on the surface of the base material.

With a condensation rate of 10 to 20 Å/sec, the intermediate layer is deposited during 10 to 15 seconds.

Cutting tools according to the invention display a high wear resistance due to the provision of a wear-resistant coating of heat-resistant compounds of high-melting metals. Such tools are also cheap, because they are made from such a cheap and readily available material as aluminum oxide.

The cutting tool manufacturing method according to the invention is simple and requires no special equipment.

DETAILED DESCRIPTION OF THE INVENTION

The invention will be better understood from the following detailed description of preferred embodiments thereof and from a consideration of examples illustrating the cutting tool manufacturing method in accordance with the invention.

According to the invention, the base material of a cutting tool is a ceramic material or an aluminum oxide-based metal-ceramic material. Deposited on the base material is a discontinuous intermediate layer of a pure metal, such as titanium or zirconium. Deposited on the intermediate layer is a coating if a wear-resistant material of heat-resistant compounds, such as carbides and nitrides, of high-melting metals, such as titanium or zirconium. The intermediate layer only covers defects on the surface of the base material.

The cutting tool manufacturing method according to the invention comprises condensation of plasma matter and ion bombardment which are carried out in order to successively deposit on the base material an intermediate layer of a pure metal and a wear-resistant coating of heat-resistant compounds of high-melting metals. As pointed out above, the base material is a ceramic material or an aluminum oxide-based metal-ceramic material.

The intermediate layer is deposited with the tool being maintained at a temperature of $\frac{1}{2}T_S > T > \frac{1}{3}T_S$, where $T_S$ is the melting temperature of the metal being deposited in °K. The condensation rate and the duration of deposition are selected bearing in mind that metal only has to be deposited on defects found on the surface of the base material.

Condensation of the metal phase is carried out at a rate of 10 to 20 Å/sec without using an electric field for acceleration. The process is carried out during 10 to 15 seconds.

The amount of metal to be deposited depends on the incidence and nature of defects on the surface of the base material. It is selected experimentally, for which purpose the surface of the base material with an intermediate layer deposited on it is viewed through an optical microscope in a dark field. The magnification is 300×. The amount of metal to be deposited is selected with due regard for the temperature to which the tool has to be heated and is such that defect-free areas are not covered by the intermediate layer.

The crystallization of the intermediate layer takes place at a temperature $\frac{1}{2}T_S > T > \frac{1}{3}T_S$. At this temperature, atoms of metal adsorbed on the surface of the cutting tool migrate and reach areas of elevated surface energy, such as cracks, chipped-off and loosened areas, interfaces between grains, growth defects, etc. The migration is activated by the arc discharge radiation. The thermal energy resulting from the vapor-to-crystal transformation is transmitted by adsorbed atmos to those areas of the tool surface where surface energy is concentrated. Adsorbed atoms crystallize in these areas and prevent the development or growth of cracks by reducing the free surface energy level.

The metal deposited on the tool surface covers over defect and levels off the electron shells of surface atoms. The result is a strong bond between the base material and the intermediate layer. The discontinuous intermediate layer also reduces stresses between the base material and the wear-resistant coating, which are due to different thermal expansion coefficients of the base material and the material of the coating.

Deposited on the intermediate layer is a wear-resistant coating of a heat-resistant compound, such as titanium nitride. The coating performs three functions:

1. It redistributes the surface energy which is removed from the surface of the base material and concentrates on the surface of the wear-resistant coating.

2. The deposition of the wear-resistant layer through condensation of the metal phase of the plasma is affected by a number of factors, including the high temperature of the tool surface and the shock effects of the plasma beam consisting, for example, of titanium and nitrogen ions. As a result, compressive stresses are produced in the wear-resistant coating, whereby the mechanical properties of the tool are improved. 3. The wear-resistant coating is in itself a guarantee of a long service life and effective performance of the tool.

The following examples illustrate the method for manufacturing cutting tools in accordance with the invention.

EXAMPLE 1

Throw-away tips of a metal-ceramic material consisting of $Al_2O_3$ with high-melting metals as additives were provided with a wear-resistant coating of titanium nitride. The tips were fixed in a holder and placed in a BULAT vacuum chamber.

The chamber was evacuated to $1.10^{-5}$ of mercury and a negative potential of 1.15 KV was applied to the tips.

An electric arc discharge was produced between the tips and a consumable cathode, and the cutting surface of the tips was exposed to accelerated ions of titanium. The surface of the tips was thus cleaned from adsorbed impurities and at the same time heated to a temperature of 600 to 620° C. by absorbing the kinetic energy of the ions. Upon reaching this temperature level, the high-voltage potential was removed and a negative potential of 300 V was applied to the tools. With an arc current of 70 A, titanium was deposited on the surface of the tips during 15 seconds. The condensation rate was 15 Å/sec.

Under such conditions, titanium crystallized on defective areas of the tool surface, which acted as drains for the metal phase of the plasma beam. Thus a discontinuous intermediate layer was produced.

After the deposition of the discontinuous intermediate layer, the arc current was set at 110 A, and nitrogen was admitted into the chamber at a pressure of $4.10^{-2}$ of mercury. A layer of titanium nitride with a thickness of not more than 10 mu was deposited above the intermediate layer. The tips were then cooled to 50° C. and removed from the vacuum chamber.

Tetrahedral tips thus treated were used to cut cast iron containing 3.4 to 3.6 percent of C, 1.8 to 2.2 percent of Si, 0.96 to 1.2 percent of Mn, 0.16 to 0.3 percent of Cr, less than 0.06 percent of P, 0.01 to 0.03 percent of Mg, and less than 0.01 percent of S, the balance being Fe.

The cutting conditions were as follows: cutting depth, 0.3 mm; feed, 0.1 mm/rev; cutting speed, 270 m/min. A total of 10 tips were thus tested.

The ten tips machined a total of 4,200 workpieces, whereas ten tips without a wear-resistant coating could machine only 1,840 workpieces. Thus in the case of cutting cast iron, the wear resistance of tools according to the present invention is higher by 200 to 300 percent than that of conventional tools.

EXAMPLE 2

A tetrahedral tip of a metal-ceramic material consisting of $Al_2O_3$ with binders was provided with a discontinuous intermediate layer of titanium and a wear-resistant coating of titanium nitride the way it is described in Example 1. The tip was used to cut steel containing 0.4 to 0.5 percent of C, 0.17 to 0.37 percent of Si, and 0.5 to 0.8 percent of Mn. The cutting conditions were as follows; cutting depth, 0.3 mm; feed, 0.3 mm/rev; cutting speed, 250 m/min.

With a wear-resistant coating produced as is described in Example 1, one face of the tip was good enough to machine 90 workpieces, so the tip was good enough to machine a total of 360 workpieces. One face of a tip without a wear-resistant coating can machine only 40 workpieces, and all the four faces can machine a total of 180 pieces. Thus in the case of cutting steel of the above-mentioned composition, the wear resistance of a tool in accordance with the invention is twice higher than that of a conventional tool.

What is claimed is:

1. Cutting tools comprising: a base material which is a ceramic material or an aluminum oxide-based metal-ceramic material; a discontinuous intermediate layer of a pure material on said base material; and a wear-resistant coating of heat-resistant compounds of high-melting metals on said intermediate layer.

2. A method for manufacturing cutting tools of the type as claimed in claim 1, comprising the steps of using condensation of plasma matter and ion bombardment in order to deposit an intermediate layer of a pure metal on the base material whose temperature is $\frac{1}{2}T_S > T > \frac{1}{3}T_S$, where $T_S$ is the melting temperature of the metal being deposited and T is the temperature of said base material in °K. The condensation rate and the duration of deposition being selected bearing in mind that metal is to be deposited only on defects found on the surface of said base material; and using condensation of plasma matter and ion bombardment in order to deposit a wear-resistant coating of heat-resistant compounds of high-melting metals on said intermediate layer.

3. A method for manufacturing cutting tools as claimed in claim 2, characterized in that at a condensation rate of 10 to 20 Å/sec, said intermediate layer is deposited during 10 to 15 seconds.

* * * * *